(12) United States Patent
Ravi

(10) Patent No.: US 11,456,717 B2
(45) Date of Patent: Sep. 27, 2022

(54) INPUT DRIVE CONFIGURATION FOR REDUCING PHASE AND GAIN IMBALANCE

(71) Applicant: TEXAS INSTRUMENTS INCORPORATED, Dallas, TX (US)

(72) Inventor: Ashwin Ravi, Hosur (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 196 days.

(21) Appl. No.: 16/892,374

(22) Filed: Jun. 4, 2020

(65) Prior Publication Data

US 2021/0104997 A1  Apr. 8, 2021

(30) Foreign Application Priority Data

Oct. 3, 2019  (IN) .............................. 201941040009

(51) Int. Cl.
*H03H 7/42* (2006.01)
*H03H 7/09* (2006.01)
*H03M 1/12* (2006.01)
*H01F 27/28* (2006.01)

(52) U.S. Cl.
CPC ............. *H03H 7/425* (2013.01); *H01F 27/28* (2013.01); *H03H 7/09* (2013.01); *H03M 1/12* (2013.01)

(58) Field of Classification Search
CPC .......... H03H 1/0007; H03H 7/42; H03H 7/09; H03H 7/425; H01F 27/28

USPC ......................................... 333/177, 181, 185
See application file for complete search history.

(56) References Cited

U.S. PATENT DOCUMENTS

2005/0208901 A1* 9/2005 Chiu ........................ H04B 1/18
455/73
2014/0125126 A1* 5/2014 Akizuki .............. H03F 3/45085
307/18

OTHER PUBLICATIONS

"Wideband A/D Converter Front-End Design Consideration," Rob Reeder, et al., Analog Dialogue, 40-07, Jul. 2006 (4 pages).

* cited by examiner

*Primary Examiner* — Rakesh B Patel
(74) *Attorney, Agent, or Firm* — John R. Pessetto; Charles A. Brill; Frank D. Cimino

(57) ABSTRACT

An analog front end device comprises three transformers. A first transformer has a first input configured to receive an input signal and first and second outputs. The second and third transformers comprise a secondary stage coupled to the first and second outputs. The second transformer has a second input coupled to the first output, a third output coupled to a first device output, and a fourth output coupled to a second device output. The third transformer has a third input coupled to the second output, a fifth output coupled to the second device output, and a sixth output coupled to the first device output. The phase imbalances of the second and third transformers are substantially the same, and the amplitude imbalances of the second and third transformers are substantially the same.

21 Claims, 5 Drawing Sheets

INPUT DRIVE CONFIGURATION FOR REDUCING PHASE AND GAIN IMBALANCE

CROSS-REFERENCE TO RELATED APPLICATIONS

This application claims priority to India Provisional Application No. 201941040009, filed Oct. 3, 2019, which is hereby incorporated by reference.

BACKGROUND

A front-end signal chain for an analog to digital converter (ADC) converts a single-ended analog input signal into a differential analog input signal the ADC can convert into a digital output signal. Impedance mismatches at the two ADC inputs can cause amplitude and phase imbalance in the differential input signal, which introduce non-linearities at the beginning of the signal chain that are propagated through all other operations performed with the digital output signal. These non-linearities and in particular second harmonics can be especially problematic for multi-band ADCs in which the second harmonic for a signal in a first frequency band has a larger magnitude than a signal in a second frequency band and degrades the signal quality of the signal in the second frequency band. Many transformer and balun transformer configurations for the front-end signal chain struggle to balance improvements in phase imbalance with worsening amplitude imbalance. In addition, some configurations cannot be implemented by some types of balun transformers with certain footprints and certain numbers of pins.

SUMMARY

An apparatus comprises three transformers. The first transformer comprises a first primary winding coupled to ground and a first secondary winding coupled to a first node and a second node. The first primary winding is configured to receive an input signal at an input node. The second transformer comprises a second primary winding coupled to ground and to the first node and a second secondary winding coupled to a first output node and to a second output node. The third transformer comprises a third primary winding coupled to ground and to the second node and a third secondary winding coupled to the first output node and to the second output node. The second and third transformers are balun transformers.

In some examples, the first, second, and third secondary windings are further coupled to ground. In some implementations, the second secondary winding comprises a first output coupled to the first output node and a second output coupled to the second output node. The third secondary winding comprises a third output coupled to the second output node and a fourth output coupled to the first output node. In some examples, a first capacitance between the second primary winding and the first output of the second secondary winding and a second capacitance between the third primary winding and the third output of the third secondary winding are substantially the same. A third capacitance between the second primary winding and the second output of the second secondary winding and a fourth capacitance between the third primary winding and the fourth output of the third secondary winding are substantially the same.

In some implementations, a first impedance between the input node and the first output node and a second impedance between the input node and the second output node are substantially the same. An impedance ratio of the apparatus is adjusted by adjusting an impedance ratio of the first transformer.

BRIEF DESCRIPTION OF THE DRAWINGS

For a detailed description of various examples, reference will now be made to the accompanying drawings in which.

DETAILED DESCRIPTION

In the disclosed analog front-end devices and transformer configurations, an input transformer receives an analog input signal and converts it to an analog differential input signal, which are provided to two additional balun transformers in a secondary stage. The balun transformers are inherently matched across units, such that the capacitances between the primary and secondary windings of the balun transformers are substantially the same. A first output of the first balun transformer is coupled to a second output of the second balun transformer, and second output of the first balun transformer is coupled to a first output of the second balun transformer, which cancels out substantially all first order common mode current and reduces the second order common mode current at the outputs.

Figure 1:
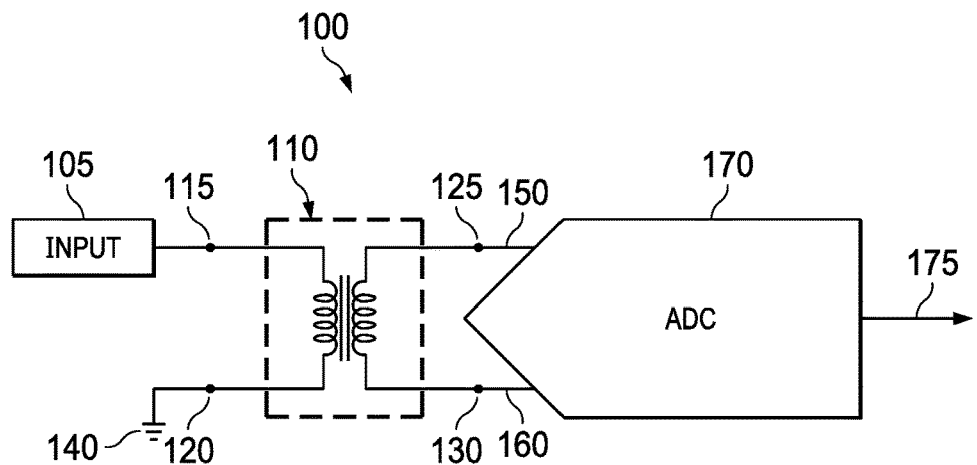
FIG. 1 illustrates a single transformer configuration for a front-end signal chain of a high speed ADC.

FIG. 1 illustrates a single transformer configuration 100 for a front-end signal chain of a high speed ADC. The configuration 100 includes a transformer 110 with input nodes 115 and 120 and output nodes 125 and 130. An RF input signal 105 is applied to input node 115, and input node 120 is coupled to ground. Output node 125 is coupled to a positive input of ADC 170, and output node 130 is coupled to a negative input of ADC 170. Transformer 110 comprises a primary and a secondary winding and converts the single-ended RF input signal 105 into a differential input signal for ADC 170. The differential input signal includes a positive input signal 150 and a negative input signal 160. ADC 170 outputs a digital output signal 175.

Non-linearity in ADC 170 and imbalanced impedances in transformer 110 introduce non-linearities in the ADC digital output signal 175, in which the second order non-linearity is dominant in terms of amplitude. For example, mismatched impedance in transformer 110 cause amplitude and phase imbalance in ADC input signals 150 and 160. Positive ADC input signal 150 may be represented as:

$$(K1)\cos(ft)$$

where K1 represents the amplitude of the positive input signal 150, f represents the frequency of the RF input signal 105, and t represents time. Negative ADC input signal 160 may be represented as:

$$-(K2)\cos(ft+\theta)$$

where K2 represents the amplitude of the negative input signal 160, f represents the frequency of the RF input signal 105, t represents time, and θ represents a phase offset of the negative input signal 160.

Figure 2:
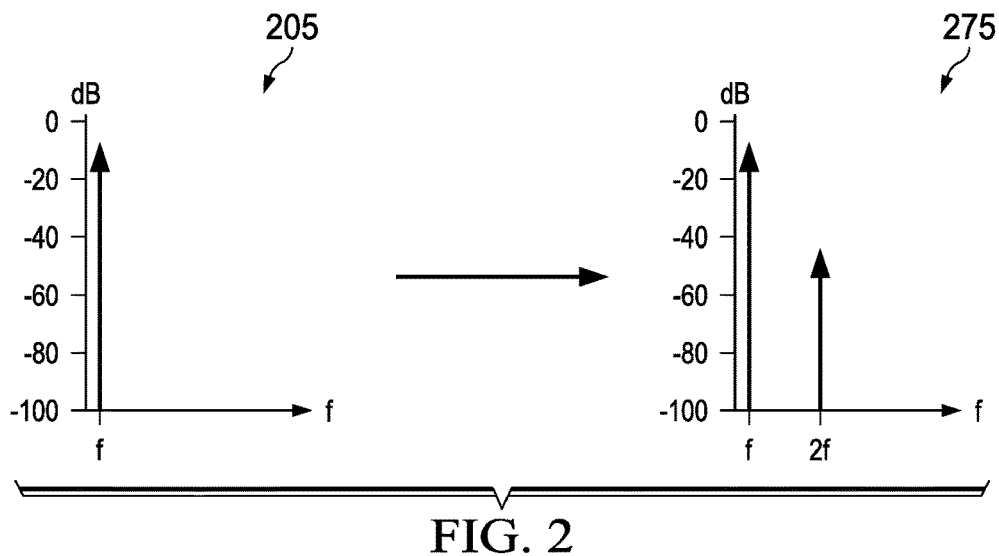
FIG. 2 illustrates the frequency spectrums of the radio frequency input signal and the ADC output signal shown in FIG. 1.

In a perfectly differential signal, the amplitudes of the positive input signal 150 and the negative input signal 160 are the same and the phase of the negative input signal 160 is 180 degrees offset from the phase of the positive input signal 150. However due to impedance mismatches, K1 and K2 can be unequal and the phase offset θ can be less than or more than zero degrees. As illustrated in the frequency spectrum graphs shown in FIG. 2, the ADC output 275 for the single frequency RF input signal 205 can demonstrate second order effects at a second frequency, introducing non-linearity into signal processing performed on the ADC output signal.

Figure 3:
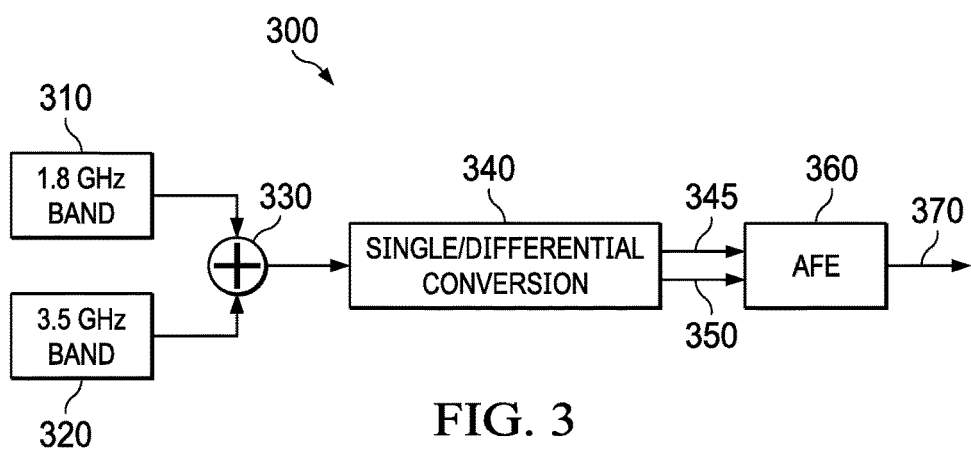
FIG. 3 illustrates a front-end signal chain for a multi-band ADC.

FIG. 3 illustrates a front-end signal chain for a multi-band ADC. The signal chain 300 includes a first RF input signal 310 within a 1.8 GigaHertz (GHz) frequency band and a second RF input signal 320 within a 3.5 GHz frequency band. The input signals 310 and 320 are combined by a combiner 330, and the combined signal is converted to a differential signal through a balun transformer 340. The positive differential input signal 345 and the negative differential input signal 350 output from balun transformer 340 is input to the analog front-end (AFE) signal processing module 360, which includes a dualband ADC rather than two separate ADCs for each of the 1.8 GHz frequency band and the 3.5 GHz frequency band. The digitized output signal 370 comprises baseband data which may be used for wireless data communication or further signal processing such as range calculations, angle of arrival, and the like.

Figure 4:
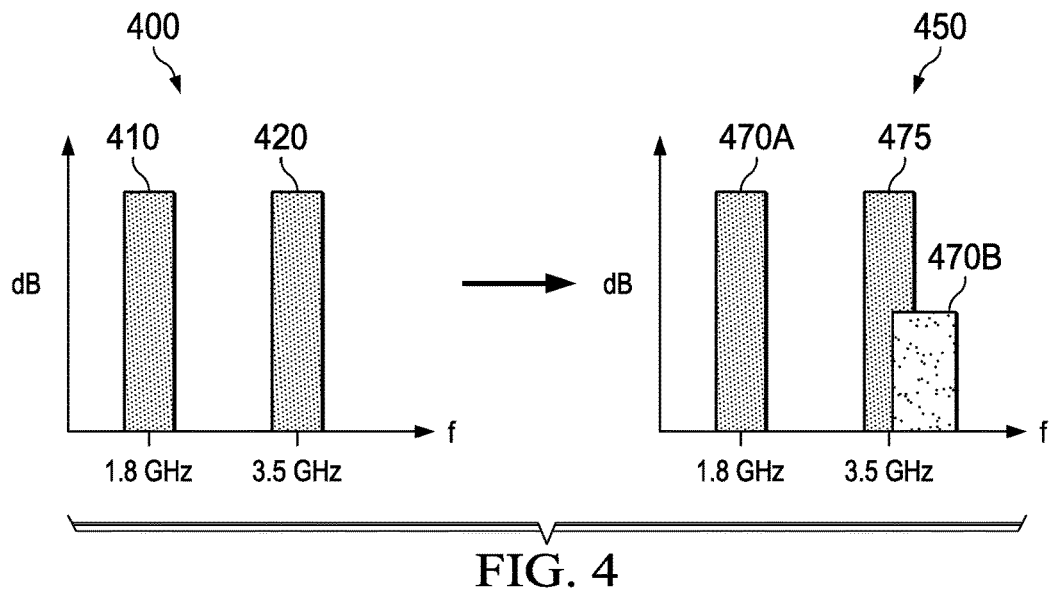
FIG. 4 illustrates the frequency spectrums of the radio frequency input signal and the multi-band ADC output signal shown in FIG. 3.

As discussed previously herein in reference to FIG. 1, mismatched impedances in balun transformer 340 can introduce second order non-linearities in the digitized output signal 370, illustrated in FIG. 4. Graph 400 illustrates the frequency spectrums of the input signal 410 in the 1.8 GHz frequency band and the input signal 420 in the 3.5 GHz frequency band of the signal chain 300 shown in FIG. 3. Graph 450 illustrates the frequency spectrums of the digitized output signal 470A which corresponds to the input signal 410 in the 1.8 GHz frequency band and the second order non-linearities 470B, which overlap with the 3.5 GHz frequency band alongside the digitized output signal 475 corresponding to the input signal 420.

The second order frequencies of the 1.8 GHz frequency band interfere with the 3.5 GHz frequency band and degrade the signal quality of signals in the 3.5 GHz frequency band. In particular, if the amplitude of the input signal in the 3.5 GHz frequency band is sufficiently less than the amplitude of the input signal in the 1.8 GHz frequency band, the signal quality in the 3.5 GHz frequency band can be severely degraded.

Figure 5:
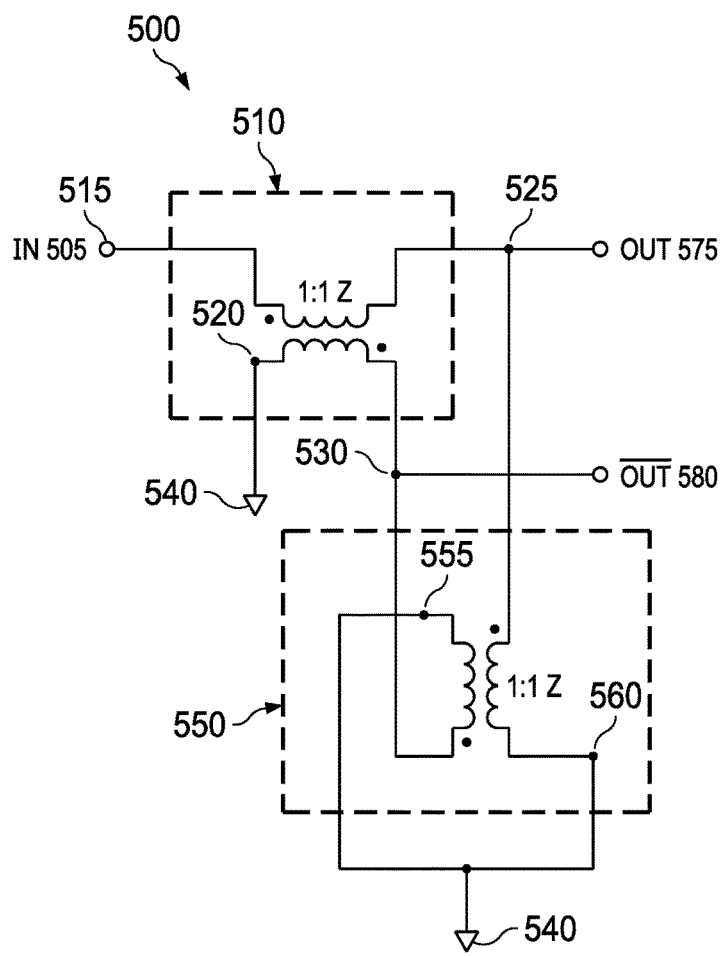
FIG. 5 illustrates a double balun configuration for a front-end signal chain of a high speed ADC.

FIG. 5 illustrates a double balun configuration 500 for a front-end signal chain of a high speed ADC. The double balun configuration includes a first balun transformer 510 and a second balun transformer 550. The first balun transformer has two input nodes 515 and 520 and two output nodes 525 and 530. The RF input signal 505 is applied to input node 515 and input node 520 is coupled to ground node 540. The positive differential output signal OUT 575 is provided to output node 525, and the negative differential output signal $\overline{\text{OUT}}$ 580 is provided to output node 530.

The second balun transformer 530 has a first input coupled to node 530 and a second input node 560 coupled to ground node 540. The second balun transformer has a first output node 555 coupled to ground node 540 and a second output node coupled to node 525. The double balun configuration 500 exhibits less phase imbalance but greater amplitude imbalance than the single transformer configuration 100 shown in FIG. 1, as will be discussed further herein with reference to FIGS. 7A-B.

Figure 6:
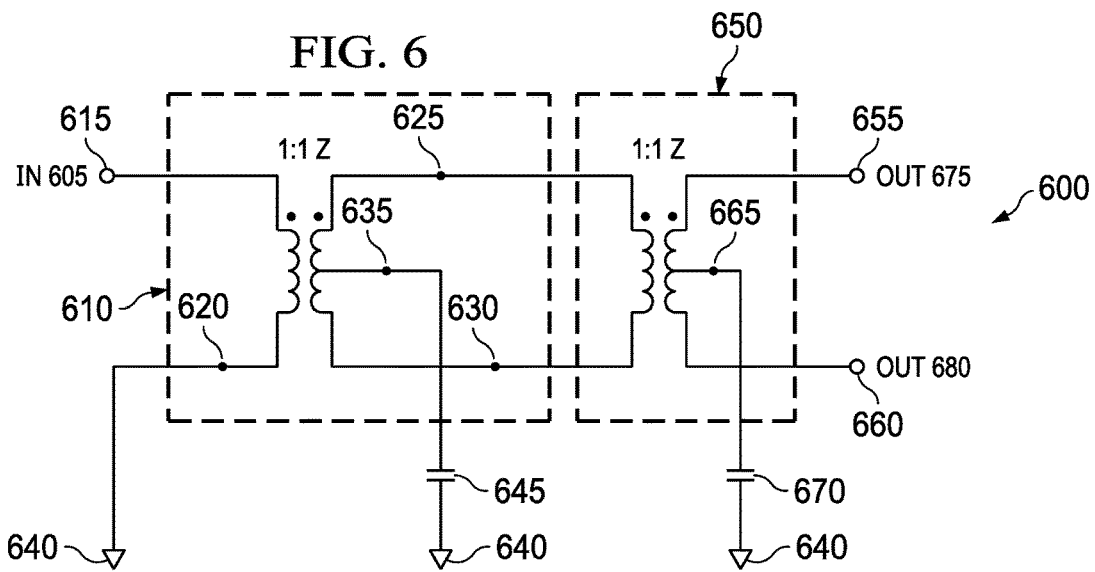
FIG. 6 illustrates a double transformer configuration of a front-end signal chain of a high speed ADC.

FIG. 6 illustrates a double transformer configuration 600 of a front-end signal chain of a high speed ADC. The double transformer configuration 600 includes a first transformer 610 and a second transformer 650. Transformer 610 has a first input node 615 to which RF input signal 605 is applied and a second input node 620 which is coupled to ground node 640. Transformer 610 has two output nodes 625 and 630. The secondary winding of transformer 610 is biased by a capacitor 645 at node 635. Capacitor 645 is further coupled to ground node 640.

Transformer 650 has an input node coupled to output node 625 of transformer 610 and an input node coupled to output node 630 of transformer 610. Transformer 650 also has two output nodes 655 and 660. The secondary winding of transformer 650 is biased by a capacitor 670 at node 665. Capacitor 670 is further coupled to ground node 640. The positive differential output signal OUT 675 is provided to output node 655, and the negative differential output signal $\overline{\text{OUT}}$ 680 is provided to output node 660. The double transformer configuration 600 exhibits less phase imbalance than the double balun configuration 500 shown in FIG. 5, but greater amplitude imbalance than the single transformer configuration 100 shown in FIG. 1.

Figure 7A:
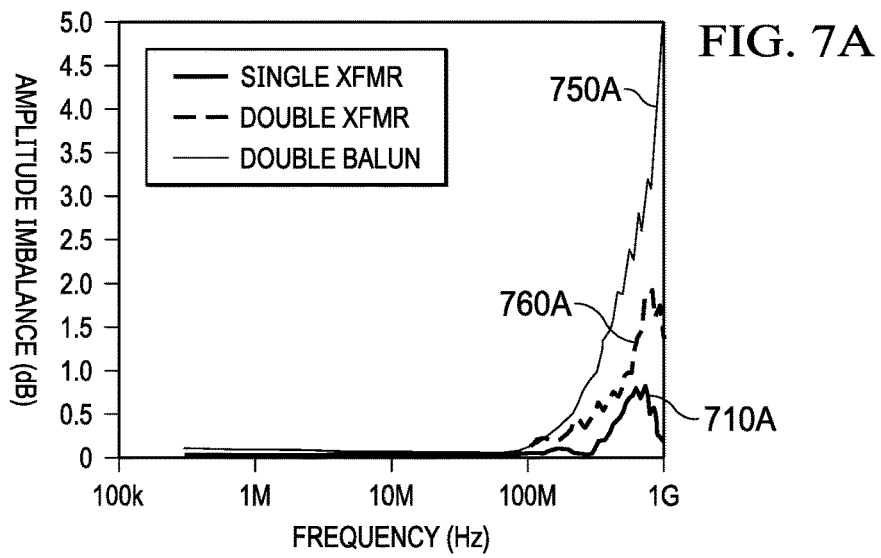
FIGS. 7A-B show graphs of the phase imbalance and amplitude imbalance for each of the single transformer, double balun, and double transformer configurations for a front-end signal chain of a high speed ADC.
Figure 7B:
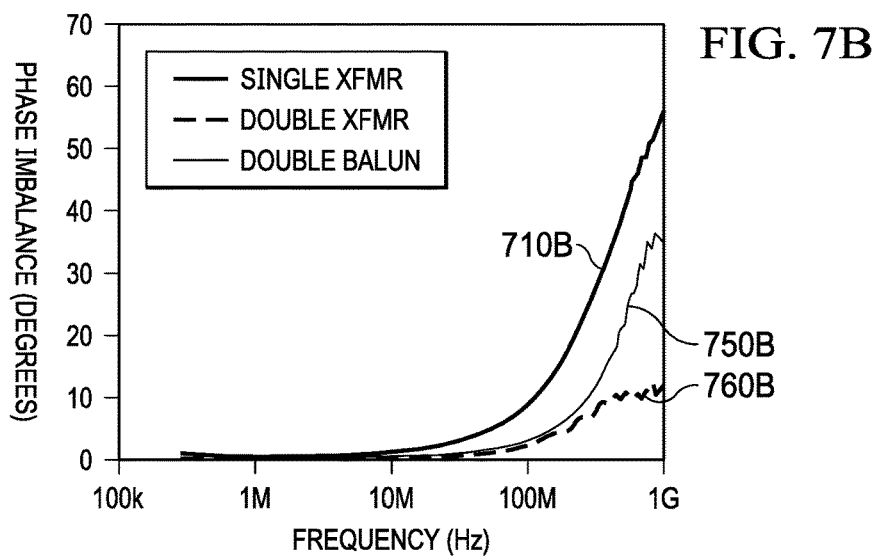

FIGS. 7A-B show graphs of the phase imbalance and amplitude imbalance for each of the single transformer configuration 100 shown in FIG. 1, the double balun configuration 500 shown in FIG. 5, and the double transformer configuration 600 shown in FIG. 6. FIG. 7A illustrates the amplitude imbalance 710A for the single transformer configuration 100, amplitude imbalance 750A for the double balun configuration 500, and amplitude imbalance 760A for the double transformer configuration 600. The amplitude imbalance 760A is less than the amplitude imbalance 750A but greater than the amplitude imbalance 710A. FIG. 7B illustrates the phase imbalance 710B for the single transformer configuration 100, phase imbalance 750B for the double balun configuration 500, and phase imbalance 760B for the double transformer configuration 600. The phase imbalance 750B is less than the phase imbalance 710B but greater than the phase imbalance 760B. The single transformer configuration 100 shown in FIG. 1, the double balun configuration 500 shown in FIG. 5, and the double transformer configuration 600 shown in FIG. 6 are described further in "Wideband A/D Converter Front-End Design Considerations" published in Analog Dialogue 40-07, July (2006).

Figure 8:
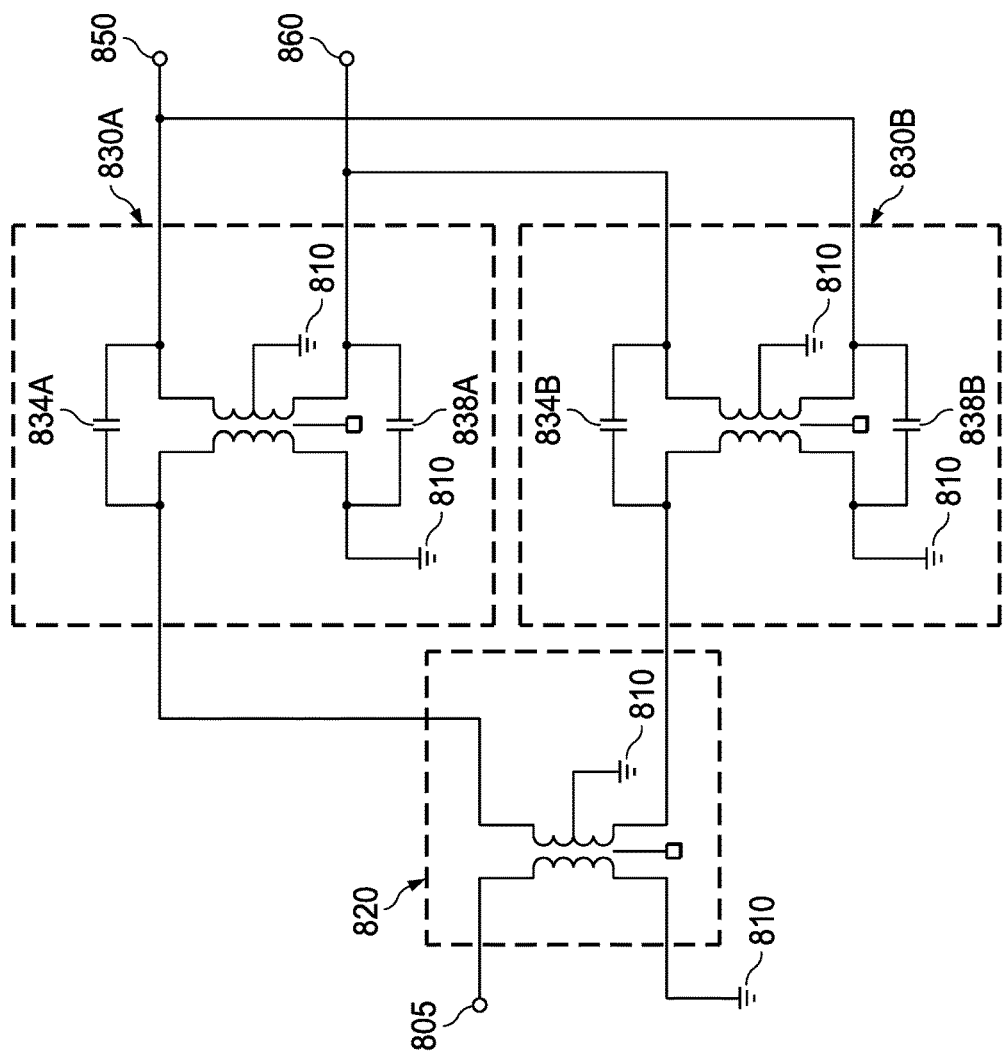
FIG. 8 illustrates an example transformer configuration of a front-end signal chain of a high speed ADC.

FIG. 8 illustrates an example transformer configuration 800 of a front-end signal chain of a high speed ADC.

Transformer configuration 800 includes an input balun transformer 820 and balun transformers 830A-B coupled together in parallel in a secondary stage. Balun transformers 830A-B are inherently matched such that the output signals of both balun transformers 830A-B exhibit substantially the same phase and amplitude imbalances. Balun transformer 820 has an input coupled to a ground node 810 and an input configured to receive the RF input signal 805. A secondary winding of transformer 820 is coupled ground node 810. A first output of transformer 820 is coupled to an input of transformer 830A, and a second output of transformer 820 is coupled to an input of transformer 830B.

A second input of transformer 830A and a secondary winding of transformer 830A are coupled to ground node 810. Transformer 830A has a first output coupled to output node 850 and a second output coupled to output node 860. Transformer 830A exhibits a first parasitic capacitance represented by capacitor 834A between the first input coupled to transformer 820 and the first output coupled to output node 850. Transformer 830A also exhibits a second parasitic capacitance represented by capacitor 838A between the second input coupled to ground node 810 and the second output coupled to output node 860.

A second input of transformer 830B and a secondary winding of transformer 830B are coupled to ground node 810. Transformer 830B has a first output coupled to output node 860 and a second output coupled to output node 850. Transformer 830B exhibits a first parasitic capacitance represented by capacitor 834B between the first input coupled to transformer 820 and the first output coupled to output node 860. Transformer 830B also exhibits a second parasitic capacitance represented by capacitor 838B between the second input coupled to ground node 810 and the second output coupled to output node 850.

Because balun transformers 830A-B are matched, the parasitic capacitances 834A-B are substantially equal, and the parasitic capacitances 838A-B are substantially equal. The symmetrical nature of balun transformers 830A-B cause output nodes 850 and 860 to exhibit substantially the same impedance, such that if the signals on output nodes 850 and 860 are reflected back from an ADC coupled to them, the signals will be reflected back substantially equally. The impedance ratio of the transformer configuration 800 can be adjusted by changing the impedance ratio of balun transformer 820.

Figure 9A:
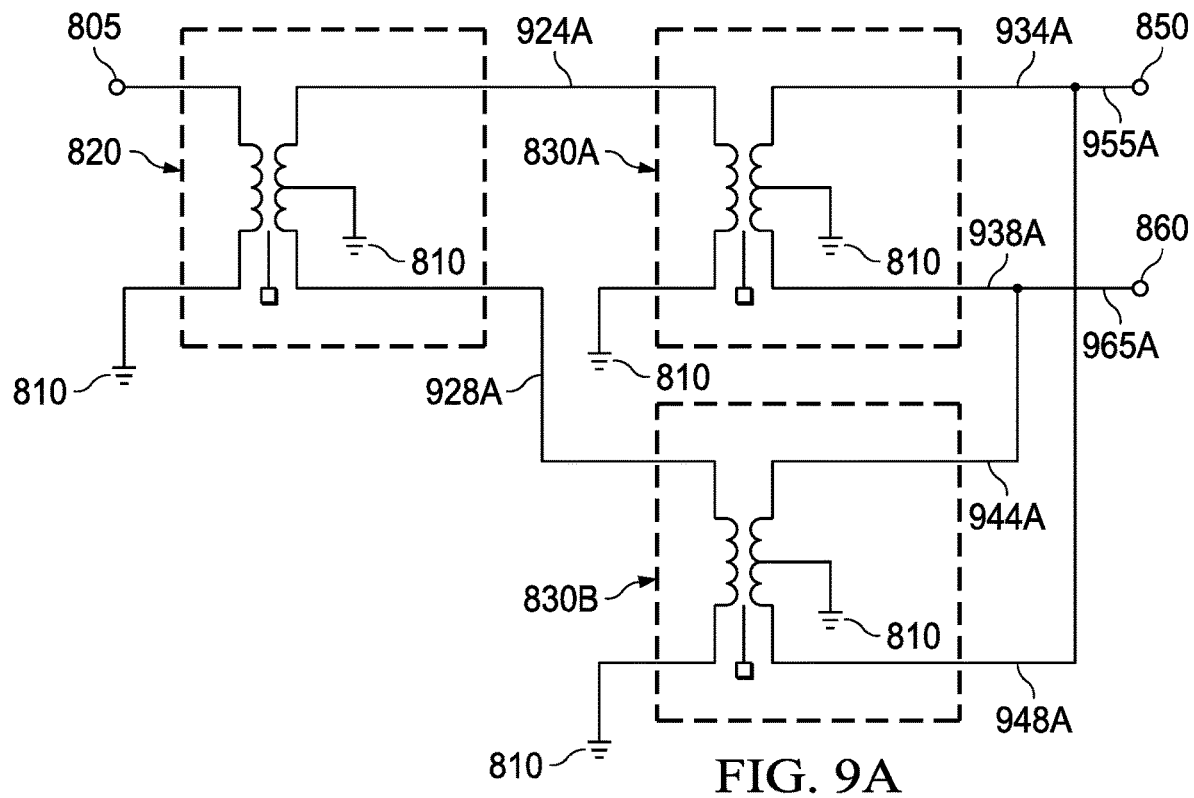
FIGS. 9A-B illustrate the cancellation of first and second order common mode current in the transformer configuration shown in FIG. 8.
Figure 9B:
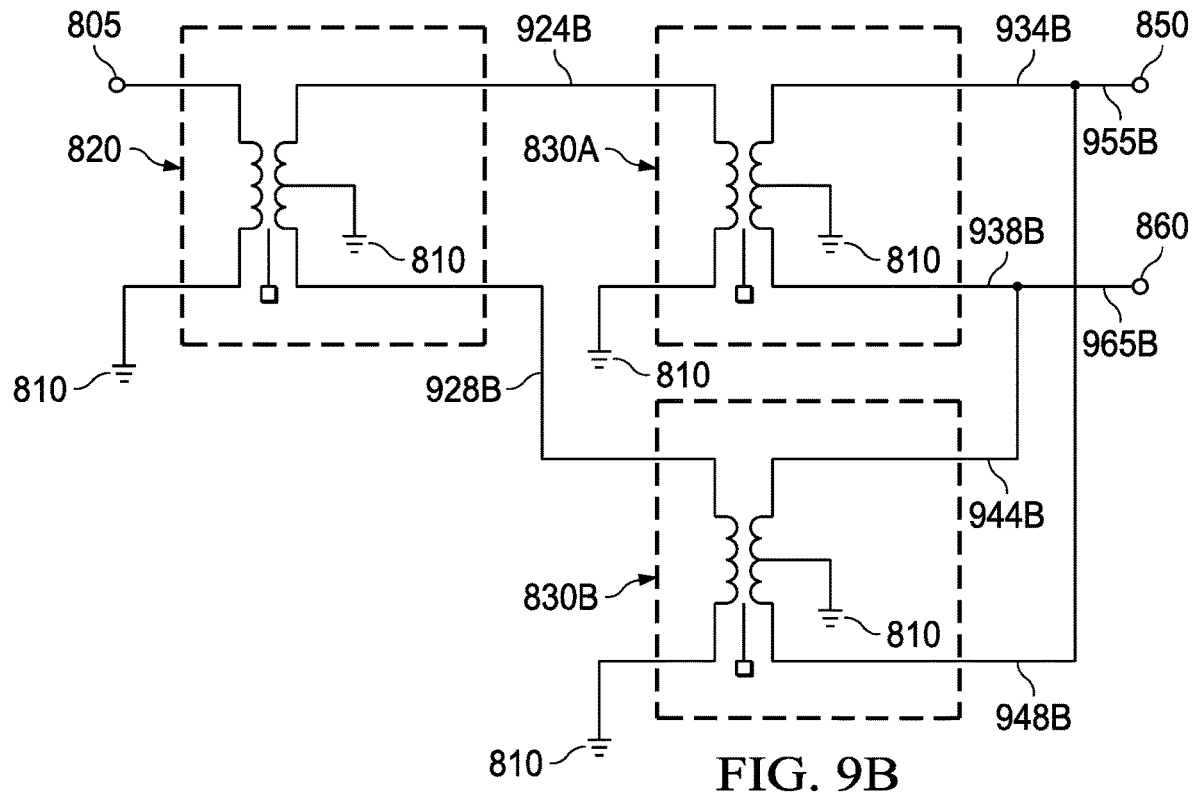

FIGS. 9A-B illustrate the cancellation and reduction of first and second order common mode current in the transformer configuration 800 shown in FIG. 8. In FIG. 9A, balun transformers 830A-B are assumed to be ideal in order to focus on cancellation of first order common mode current at output nodes 850 and 860 and ignore second order common mode current. FIG. 9B illustrates the reduction of second order common mode current in the transformer configuration 800. Returning to FIG. 9A, an output signal 924A from the first output of balun transformer 820 to the first input of balun transformer 830A may be represented as Id+Ic, where Id represents a differential current and Ic represents a common mode current resulting from impedance imbalances in balun transformer 820. An output signal 928A from the second output of transformer 820 to the first input of balun transformer 830B may be represented as −Id+Ic.

In response to the signal 924A being provided to its first input, balun transformer 830A outputs a first signal 934A from the first output and a second signal 938A from the second output. Output signal 934A may be represented as Id+Ic. Output signal 938A may be represented as −Id−Ic. In response to the signal 928A being provided to its first input, balun transformer 830B outputs a first signal 944A from its first output and a second signal 948A from its second output. Output signal 944A may be represented as −Id+Ic. Output signal 948A may be represented as Id−Ic.

Signals 934A and 948A are added together, cancelling out the first order common mode current Ic, and provided to output node 850 as output signal 955A, which may be represented as (Id+Ic)+(Id−Ic)=2 Id. Signals 938A and 944A are added together, cancelling out the first order common mode current Ic, and provided to output node 860 as output signal 965A, which may be represented as (−Id−Ic)+(−Id+Ic)=−2 Id. The resulting output signals on output nodes 850 and 860 are purely differential signals without any common mode current.

FIG. 9B includes the effect of second order common mode current. For ease of illustration, the common mode current is represented as aId, where a represents a very small multiplier, less than one, indicative of the common mode rejection in balun transformer 820. An output signal 924B from the output of balun transformer 820 to the first input of balun transformer 830A may be represented as Id+aId. An output signal 928B from the second output of balun transformer 820 to the first input of balun transformer 830B may be represented as −Id+aId.

In response to the signal 924B being provided to its first input, balun transformer 830A outputs a first signal 934B from the first output and a second signal 938B from the second output. Output signal 934B may be represented as (Id+aId)+b(Id+aId), where b represents a very small multiplier, less than one, indicative of the common mode rejection in balun transformer 830A. Output signal 938B may be represented as (−Id−aId)+b(Id+aId). In response to the signal 928B being provided to its first input, balun transformer 830B outputs a first signal 944B from its first output and a second signal 948B from its second output. Output signal 944B may be represented as (−Id+aId)+b(−Id+aId). Output signal 948B may be represented as (Id−aId)+b(−Id+aId). Because balun transformers 830A-B are inherently matched with similar parasitic capacitances, the multiplier b is substantially the same for both.

Signals 934B and 948B are added together and provided to output node 850 as output signal 955B, which may be represented as [(Id+aId)+b(Id+aId)]+[(Id−aId)+b(−Id+aId)] =2 Id+2 abId. Signals 938B and 944B are added together, and provided to output node 860 as output signal 965B, which may be represented as [(−Id−aId)+b(Id+aId)]+[(−Id+aId)+b(−Id+aId)]=−2 Id+2 abId. Multipliers a and b are both less than one, such that the second order common mode current 2 abId in each of the differential signals 955B and 965B is an order of magnitude less than the common mode current exhibited in the single transformer configuration 100 shown in FIG. 1.

Figure 10A:
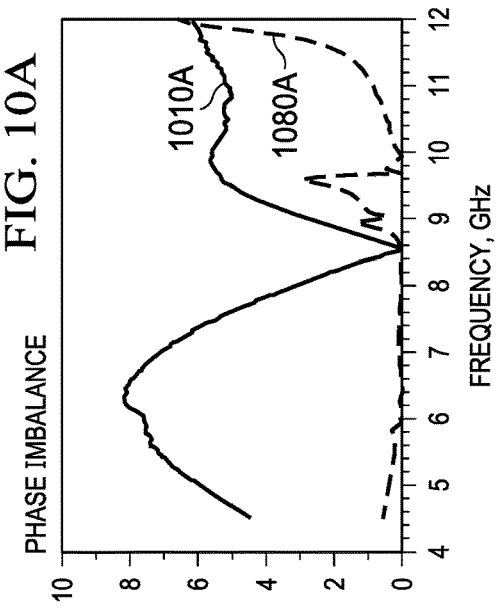
FIGS. 10A-B show graphs of the phase imbalance and amplitude imbalance for the transformer configuration shown in FIG. 8 and the single transformer configuration shown in FIG. 1.
Figure 10B:
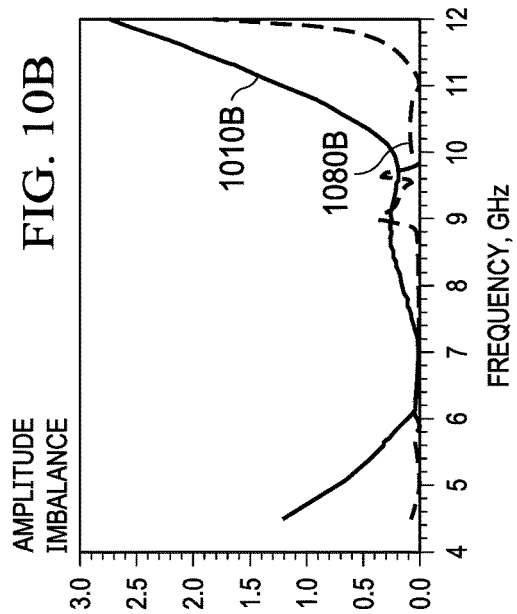

FIGS. 10A-B show graphs of the phase imbalance and amplitude imbalance for the transformer configuration shown in FIG. 8 and the single transformer configuration shown in FIG. 1. In FIG. 10A, the phase imbalance 1010A for single transformer configuration 100 is greater than the phase imbalance 1080A for the transformer configuration 800. In FIG. 10B, the amplitude imbalance 1010B for single transformer configuration 100 is greater than the amplitude imbalance 1080B for the transformer configuration 800 except for a few frequency ranges. In some implementations, the transformer configuration 800 can be a 14 decibel improvement in second harmonic distortion over transformer configuration 100 for analog front-end input for an ADC.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Unless otherwise stated, in this description, "the same" or "substantially the same" means the two are within ninety percent or more of each other.

Modifications are possible in the described embodiments, and other embodiments are possible, within the scope of the claims.

What is claimed is:

1. An apparatus, comprising:
   a first transformer comprising a first primary winding and a first secondary winding, wherein the first primary winding is coupled to ground and configured to receive an input signal at an input node, wherein the first secondary winding is coupled to a first node and to a second node;
   a second transformer comprising a second primary winding and a second secondary winding, wherein the second primary winding is directly coupled to ground and directly coupled to the first node, wherein the second secondary winding is coupled to a first output node and to a second output node; and
   a third transformer comprising a third primary winding and a third secondary winding, wherein the third primary winding is directly coupled to ground and directly coupled to the second node, wherein the third secondary winding is coupled to the first output node and to the second output node.

2. The apparatus of claim 1, wherein the second transformer comprises a first balun transformer, and wherein the third transformer comprises a second balun transformer.

3. The apparatus of claim 1, wherein the first, second, and third secondary windings are further coupled to ground.

4. The apparatus of claim 1, wherein the second secondary winding comprises a first output coupled to the first output node and a second output coupled to the second output node, and wherein the third secondary winding comprises a third output coupled to the second output node and a fourth output coupled to the first output node.

5. The apparatus of claim 4, wherein a first capacitance between the second primary winding and the first output of the second secondary winding and a second capacitance between the third primary winding and the third output of the third secondary winding are substantially the same.

6. The apparatus of claim 4, wherein a first capacitance between the second primary winding and the second output of the second secondary winding and a second capacitance between the third primary winding and the fourth output of the third secondary winding are substantially the same.

7. The apparatus of claim 4, wherein a first impedance between the input node and the first output node and a second impedance between the input node and the second output node are substantially the same.

8. The apparatus of claim 7, wherein an impedance ratio of the apparatus is adjusted by adjusting an impedance ratio of the first transformer.

9. An input drive configuration, comprising:
   a transformer comprising a first primary winding coupled to ground and configured to receive an input signal at an input node and a first secondary winding; and
   a secondary stage coupled to the first secondary winding, comprising:
      a first balun transformer comprising a second primary winding and a second secondary winding, wherein the second primary winding is directly coupled to ground and directly coupled to a first output of the first secondary winding, wherein a first output of the second secondary winding is coupled to a first output node and a second output of the second secondary winding is coupled to a second output node; and
      a second balun transformer comprising a third primary winding and a third secondary winding, wherein the third primary winding is directly coupled to ground and directly coupled to a second output of the first secondary winding, wherein a first output of the third secondary winding is coupled to the second output node and a second output of the third secondary winding is coupled to the first output node.

10. The input drive configuration of claim 9, wherein the first, second, and third secondary windings are further coupled to ground.

11. The input drive configuration of claim 9, wherein a first capacitance between the second primary winding and the first output of the second secondary winding and a second capacitance between the third primary winding and the first output of the third secondary winding are substantially the same.

12. The input drive configuration of claim 11, wherein a third capacitance between the second primary winding and the second output of the second secondary winding and a fourth capacitance between the third primary winding and the second output of the third secondary winding are substantially the same.

13. The input drive configuration of claim 9, wherein the input drive configuration is configured to receive a single-ended input signal at the input node and output a differential signal at the first and second output nodes.

14. The input drive configuration of claim 13, wherein the first output node and the second output node are coupled to an analog-to-digital converter.

15. The input drive configuration of claim 9, wherein a first impedance between the input node and the first output node and a second impedance between the input node and the second output node are substantially the same.

16. The input drive configuration of claim 15, wherein an impedance ratio of the input drive configuration is adjusted by adjusting an impedance ratio of the transformer.

17. An analog front-end device, comprising:
   a transformer having a first input configured to receive an input signal, a first output, and a second output; and
   a secondary stage coupled to the first and second outputs, comprising:
      a first balun transformer having a second input directly coupled to the first output, a third output coupled to a first device output, and a fourth output coupled to a second device output, and
      a second balun transformer having a third input directly coupled to the second output, a fifth output coupled to the second device output, and a sixth output coupled to the first device output,
      wherein a phase imbalance of the first balun transformer is substantially the same as a phase imbalance of the second balun transformer, and wherein an amplitude imbalance of the first balun transformer is substantially the same as an amplitude imbalance of the second balun transformer.

18. The analog front-end device of claim 17, wherein an impedance ratio of the input drive configuration is adjusted by adjusting an impedance ratio of the transformer.

19. The analog front-end device of claim 17, wherein the analog front-end device is configured to output a differential signal on the first and second device outputs.

20. The analog front-end device of claim 19, wherein the first and second device outputs are coupled to an analog-to-digital converter.

21. The analog front-end device of claim 17, wherein a first capacitance between the second input and the third output is substantially the same as a second capacitance between the third input and the fifth output, and wherein a third capacitance between the second input and the fourth output is substantially the same as a fourth capacitance between the second input and the sixth output.

\* \* \* \* \*